(12) United States Patent
Matsunaga et al.

(10) Patent No.: US 11,343,946 B2
(45) Date of Patent: May 24, 2022

(54) COOLING SYSTEM AND REFRIGERANT CONTROL METHOD FOR COOLING SYSTEM

(71) Applicant: NEC Corporation, Tokyo (JP)

(72) Inventors: Arihiro Matsunaga, Tokyo (JP); Koichi Todoroki, Tokyo (JP); Hisato Sakuma, Tokyo (JP); Minoru Yoshikawa, Tokyo (JP)

(73) Assignee: NEC CORPORATION, Tokyo (JP)

( * ) Notice: Subject to any disclaimer, the term of this patent is extended or adjusted under 35 U.S.C. 154(b) by 377 days.

(21) Appl. No.: 16/479,630

(22) PCT Filed: Mar. 30, 2017

(86) PCT No.: PCT/JP2017/013210
§ 371 (c)(1),
(2) Date: Jul. 22, 2019

(87) PCT Pub. No.: WO2018/179204
PCT Pub. Date: Oct. 4, 2018

(65) Prior Publication Data
US 2021/0337705 A1 Oct. 28, 2021

(51) Int. Cl.
*F25B 41/20* (2021.01)
*F25B 1/08* (2006.01)
(Continued)

(52) U.S. Cl.
CPC .......... *H05K 7/20836* (2013.01); *F25B 1/08* (2013.01); *F25B 41/00* (2013.01); *F25B 41/20* (2021.01);
(Continued)

(58) Field of Classification Search
CPC ............ H05K 7/20836; H05K 7/20827; F25B 49/022; F25B 41/00; F25B 2700/21162; F25B 2600/21; F25B 2600/027
See application file for complete search history.

(56) References Cited

FOREIGN PATENT DOCUMENTS

JP 62-066065 A 3/1987
JP 03-170749 A 7/1991
(Continued)

OTHER PUBLICATIONS

International Search Report for PCT/JP2017/013210 dated Jun. 20, 2017 (PCT/ISA/210).

*Primary Examiner* — Lionel Nouketcha

(57) ABSTRACT

A cooling system including a vaporizer configured to absorb heat due to a liquid-phase refrigerant being vaporized, a condenser configured to discharge heat due to a refrigerant in a gaseous phase state being liquefied, a resistance body provided in a middle of a pipe passage ranging from the vaporizer to the condenser and applying a resistance to the refrigerant, state detection sensors provided in the pipe passage on an upstream and downstream sides of the resistance body and detecting a state of the refrigerant flowing through each side inside the pipe passage, and a flow rate controller configured to detect droplets in the refrigerant flowing through the pipe passage on the basis of a difference between detection values of the state detection sensors which are detected on the upstream and downstream sides of the resistance body, and controls a flow rate of the refrigerant on the basis of detection results.

10 Claims, 3 Drawing Sheets

(51) Int. Cl.
   *F25B 41/00*   (2021.01)
   *F25B 45/00*   (2006.01)
   *F25B 49/02*   (2006.01)
   *H05K 7/20*    (2006.01)

(52) U.S. Cl.
   CPC ............ *F25B 45/00* (2013.01); *F25B 49/022* (2013.01); *F25B 49/027* (2013.01); *H05K 7/20309* (2013.01); *H05K 7/20318* (2013.01); *H05K 7/20827* (2013.01); *F25B 2600/027* (2013.01); *F25B 2600/19* (2013.01); *F25B 2600/21* (2013.01); *F25B 2700/1331* (2013.01); *F25B 2700/21162* (2013.01)

(56) References Cited

FOREIGN PATENT DOCUMENTS

| | | | |
|---|---|---|---|
| JP | H0317074 A | * | 7/1991 |
| JP | 05-322322 A | | 12/1993 |
| JP | 11-316058 A | | 11/1999 |

* cited by examiner

COOLING SYSTEM AND REFRIGERANT CONTROL METHOD FOR COOLING SYSTEM

CROSS REFERENCE TO RELATED APPLICATIONS

This application is a National Stage of International Application No. PCT/JP2017/013210 filed Mar. 30, 2017, the disclosure of which is incorporated herein in its entirety by reference.

TECHNICAL FIELD

The present invention relates to a cooling system and a refrigerant control method for the cooling system for efficiently exhausting heat from electronic equipment.

BACKGROUND ART

In a data center in which a large number of pieces of electronic equipment are densely arranged, a large amount of heat is exhausted, and thus the data center is equipped with a heat exchange system which exhausts heat using a phase change cycle of evaporation and condensation of a refrigerant in order to maintain a processing capability.

As such a heat exchange system, for example, an air conditioner disclosed in Patent Document 1 is known.

The air conditioner disclosed in Patent Document 1 has a forced operation cycle and a natural cycle. The forced operation cycle is configured such that a compressor, a condenser, an electronic expansion valve capable of controlling the opening of a valve, and a vaporizer are sequentially connected to each other through piping. The natural cycle bypasses the compressor. In a case of the forced operation cycle, a refrigerant is made to pass through the compressor so that a pressure state of the refrigerant is controlled.

CITATION LIST

Patent Document

[Patent Document 1]
Japanese Unexamined Patent Application, First Publication No. H11-316058

SUMMARY OF INVENTION

Technical Problem

However, in the air conditioner disclosed in Patent Document 1, a gaseous phase refrigerant is made to pass through the compressor so that a pressure state of the refrigerant is controlled in a case of the forced operation cycle, but it is not assumed that a liquid phase refrigerant is mixed into a gaseous phase refrigerant.

Specifically, in a case where a liquid phase refrigerant is mixed into a gaseous phase refrigerant flowing through a pipe passage spanning from a vaporizer to a condenser, a compressor may be damaged due to the kinetic energy of droplets moving inside the pipe passage, but a countermeasure for such a disadvantage is not taken into consideration in Patent Document 1 described above.

The present invention is contrived in view of such situations and provides a cooling system and a refrigerant control method for the cooling system which are capable of detecting whether or not droplets have been mixed into a gaseous phase refrigerant flowing through a pipe passage ranging from a vaporizer to a condenser by using a simple method and which are capable of efficiently operating an operation cycle by eliminating a situation where a liquid phase refrigerant is mixed into a gaseous phase refrigerant on the basis of detection results.

Solution to Problem

In order to solve the above-described problem, the present invention proposes the following means.

According to a first aspect of the present invention, there is provided a cooling system including a vaporizer which is configured to absorb heat due to a liquid-phase refrigerant being vaporized, a condenser which is configured to discharge heat due to a refrigerant in a gaseous phase state being liquefied, a resistance body which is provided in a middle of a pipe passage ranging from the vaporizer to the condenser and is configured to apply a resistance to the refrigerant through the pipe passage, state detection sensors which are provided in the pipe passage on an upstream side and a downstream side of the resistance body and are configured to detect the presence of droplets in the refrigerant flowing through the pipe passage on the basis of a difference between detection values of the state detection sensors which are detected on the upstream side and the downstream side of the resistor, and a flow rate control means which is configured to control a flow rate of the refrigerant on the basis of detection results of the state detection sensors.

According to a second aspect of the present invention, there is provided a refrigerant control method for cooling system including a vaporizer which is configured to absorb heat due to a liquid-phase refrigerant being vaporized and a condenser which is configured to discharge heat due to a refrigerant in a gaseous phase state being liquefied and cooling a cooling target positioned in a vicinity of the vaporizer by circulating the refrigerant between the vaporizer and the condenser, the refrigerant control method including measuring a difference between a temperature of the refrigerant inside a pipe passage on an upstream side before a resistance is applied to the refrigerant and a temperature of the refrigerant inside the pipe passage on a downstream side after the resistance is applied while applying the resistance to the refrigerant flowing inside the pipe passage in a middle of the pipe passage ranging from the vaporizer to the condenser, and reducing a flow rate of a liquid phase refrigerant to be supplied to the condenser in a case where the difference in temperature is equal to or greater than a threshold value.

Advantageous Effects of Invention

According to the present invention, in a case where droplets are mixed into a gaseous phase refrigerant flowing through a pipe passage ranging from a vaporizer to a condenser, a process of reducing a flow rate of the refrigerant is performed to eliminate a situation where a liquid phase refrigerant is mixed into the gaseous phase refrigerant, whereby it is possible to efficiently operate an operation cycle.

DESCRIPTION OF EMBODIMENTS

Figure 1:
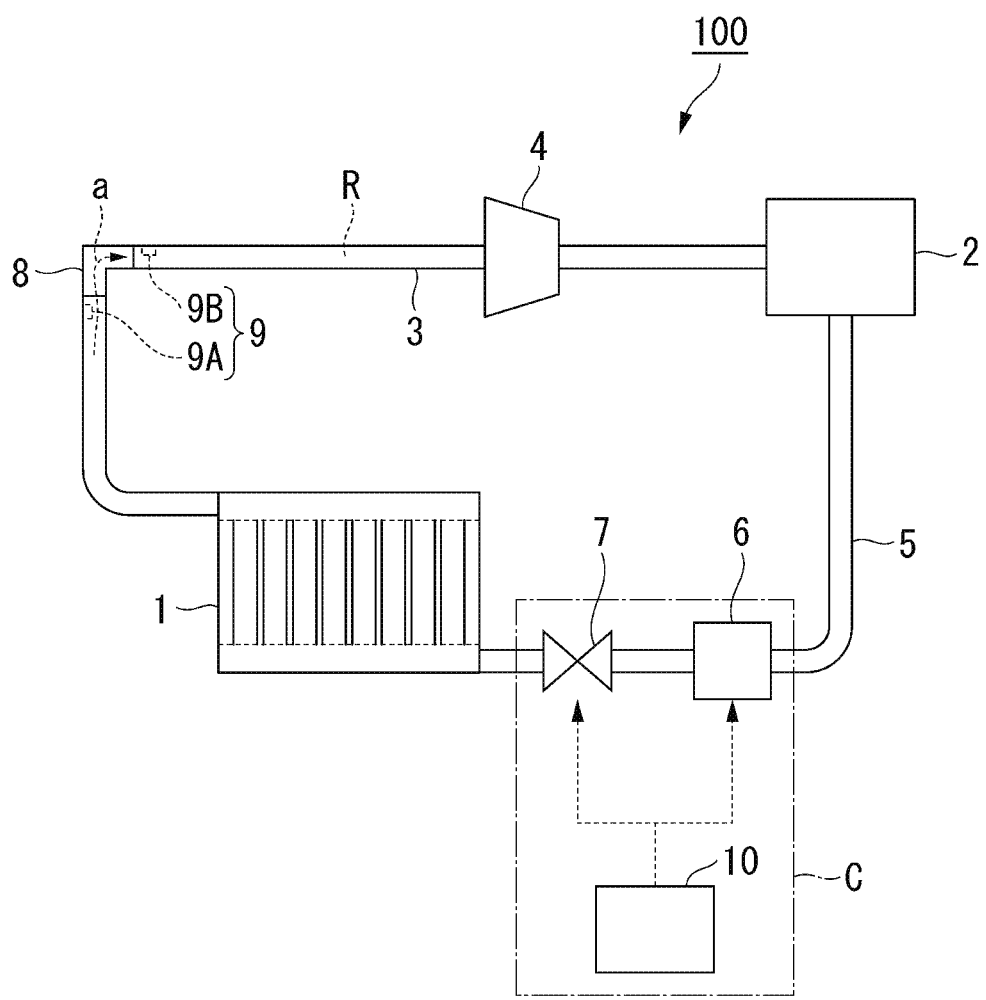
FIG. 1 is a schematic configuration diagram of a cooling system according to the present invention.

A cooling system 100 according to a minimum configuration of the present invention will be described with reference to FIG. 1.

The cooling system 100 includes a vaporizer 1 that absorbs heat exhausted from electronic equipment (not shown) due to a liquid-phase refrigerant R being vaporized, a condenser 2 that discharges heat due to the refrigerant R in a gaseous phase state being liquefied, a compressor 4 which is provided in the middle of a pipe passage 3 ranging from the vaporizer 1 to the condenser 2, a pump 6 which is provided in the middle of the pipe passage 5 ranging from the condenser 2 to the vaporizer 1, and an electromagnetic flow rate regulation valve 7 as main components.

In addition, the cooling system 100 includes a resistance body 8 which is installed in the middle of the pipe passage 3 ranging from the vaporizer 1 to the condenser 2, a state detection sensor 9 which is installed in the vicinity of the resistance body 8 and detects the state of the refrigerant R flowing inside the pipe passage 3, and a flow rate control means C that controls a flow rate of the refrigerant R on the basis of a detection value of the state detection sensor 9.

The resistance body 8 applies a resistance to the refrigerant R flowing inside the pipe passage 3, and a bent pipe that changes a refrigerant flow direction inside the pipe passage 3 as indicated by, for example, an arrow a is used as the resistance body.

The state detection sensors 9 are provided inside the pipe passage 3 on an upstream side and a downstream side of a flow passage change point in the resistance body 8 and are constituted by, for example, a pair of temperature sensors 9A and 9B that determine the temperature of the refrigerant R flowing through each side inside the pipe passage 3.

The flow rate control means C detects the presence of droplets in the refrigerant R flowing inside the pipe passage 3 on the basis of a difference between detection values of the state detection sensors which are detected on the upstream side and the downstream side of the resistance body 8 and controls a flow rate of the refrigerant R on the basis of the detection result.

Specifically, the flow rate control means C includes the pump 6 and the electromagnetic flow rate regulation valve 7 which are provided in the middle of the pipe passage 5 ranging from the condenser 2 to the vaporizer 1, and includes a controller 10 that regulates the amount of discharge of the pump 6 and/or the opening of the electromagnetic flow rate regulation valve 7 to control a flow rate of the refrigerant R in a case where it is determined that a liquid phase is present in the refrigerant R flowing inside the pipe passage 3 on the basis of the difference between the detection values of the state detection sensors 9.

In the cooling system 100 according to the present invention described above in detail, a resistance is applied to the refrigerant R flowing inside the pipe passage 3 by the resistance body 8 in the middle of the pipe passage 3 ranging from the vaporizer 1 to the condenser 2.

In this case, the state (for example, temperature) of the refrigerant R flowing through the pipe passage 3 is obtained by the state detection sensor 9 (9A) installed on the upstream side of the resistance body 8 and the state detection sensor 9 (9B) installed in the pipe passage 3 on the downstream side of the resistance body 8, and then a flow rate of the refrigerant is regulated on the basis of a difference between detection values of the state detection sensors 9 by the flow rate control means C.

For example, in a case where a difference in temperature between the pair of temperature sensors 9A and 9B respectively provided before and behind the resistance body 8 as the state detection sensors 9 exceeds a predetermined threshold value, the flow rate control means C determines that droplets have been mixed into the gaseous phase refrigerant R and is able to perform control for reducing a flow rate of a liquid phase refrigerant to be supplied to the condenser 2.

That is, in the cooling system 100 according to the present invention, in a case where droplets are mixed into the gaseous phase refrigerant R flowing inside the pipe passage 3 ranging from the vaporizer 1 to the condenser 2, a process of reducing a flow rate of a refrigerant is performed to eliminate a situation where the liquid phase refrigerant R is mixed into the gaseous phase refrigerant R, whereby it is possible to efficiently operate an operation cycle.

Embodiment

A cooling system 101 according to an embodiment of the present invention will be described with reference to FIGS. 2 to 5.

Figure 2:
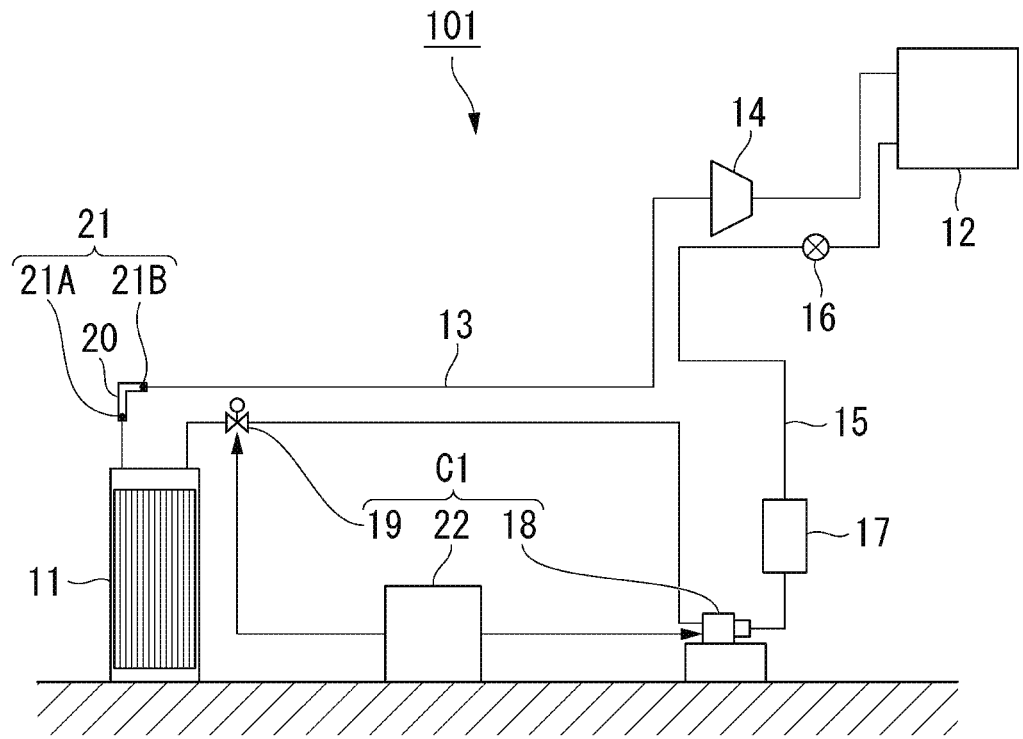
FIG. 2 is a schematic configuration diagram of a cooling system according to an embodiment of the present invention.

As shown in FIG. 2, the cooling system 101 includes a vaporizer 11 that absorbs heat exhausted from electronic equipment (not shown) due to a liquid-phase refrigerant R being vaporized, a condenser 12 that discharges heat due to the refrigerant R in a gaseous phase state being liquefied, and a compressor 14 which is provided in the middle of a gaseous phase pipe 13 ranging from the vaporizer 11 to the condenser 12.

Further, in the cooling system 101, an expansion valve 16, a tank 17, a pump 18, and an electromagnetic flow rate regulation valve 19 are sequentially connected in the middle of a liquid phase pipe 15 ranging from the condenser 12 to the vaporizer 11.

Among these components, the expansion valve 16 is configured to reduce the pressure of the refrigerant R condensed by the condenser 12 to lower a boiling point of a refrigerant liquid and is thus installed to facilitate vaporization using the vaporizer 11.

Figure 3:
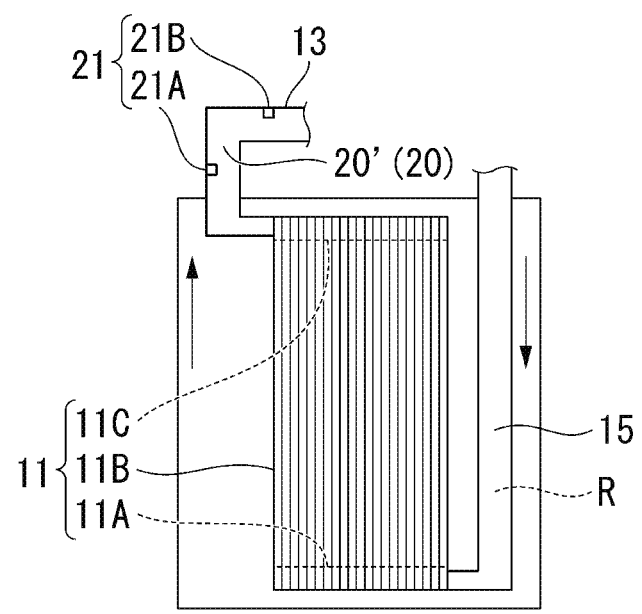
FIG. 3 is a schematic configuration diagram showing the vicinity of a condenser of the cooling system of FIG. 2.

In addition, as shown in FIG. 3, the vaporizer 11 includes a lower header 11A of which an inlet is connected to the liquid phase pipe 15 through which the liquid-phase refrigerant R flows, a plurality of heat exchange pipes 11B which extend upwards from the lower header 11A, and an upper header 11C which collects refrigerant R received by the heat exchange pipes 11B and supplies the collected refrigerants to the gaseous phase pipe 13 through an outlet thereof.

In addition, the cooling system 101 includes a resistance body 20 which is installed in the middle of the gaseous phase pipe 13 ranging from the vaporizer 11 to the condenser 12, a state detection sensor 21 which is installed in the vicinity of the resistance body 20 and detects the state of the refrigerant R flowing inside the gaseous phase pipe 13, and a flow rate control means C1 that controls a flow rate of the refrigerant R on the basis of a detection value of the state detection sensor 21.

The resistance body 20 is installed in the middle of the gaseous phase pipe 13 and applies a resistance to the refrigerant R flowing inside the gaseous phase pipe 13, and for example, a bent pipe or direction changing pipe 20' (hereinafter, referred to as a direction changing pipe) changing a refrigerant flow direction inside the gaseous phase pipe 13 by 90 degrees is used as the resistance body 20. The bending angle of the direction changing pipe 20' is not limited to 90 degrees and may be set to 30 degrees to 200 degrees depending on conditions of a surrounding installation space.

Figure 4:
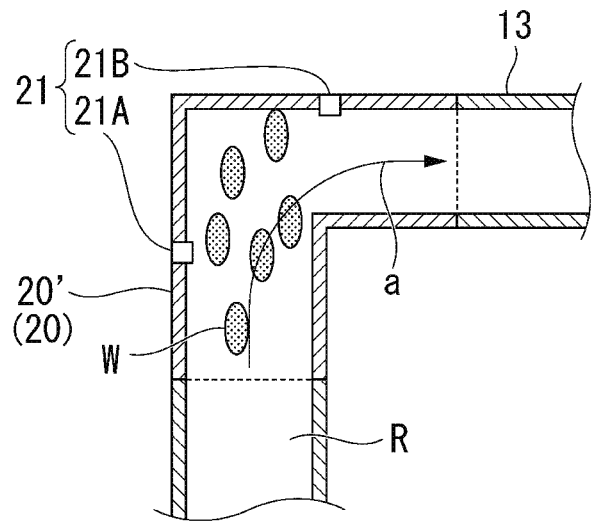
FIG. 4 is a diagram showing a pressure loss of a refrigerant in a resistance body.

As shown in FIG. 4 in detail, the state detection sensors 21 are provided in the pipe passage on an upstream side and a downstream side of a flow passage change point in the resistance body 20 and are constituted by a pair of temperature sensors 21A and 21B that determine the temperature of the refrigerant R flowing through the respective sides inside the gaseous phase pipe 13.

That is, the temperature sensor 21A is installed on the upstream side of the flow passage change point in the direction changing pipe 20', and the temperature sensor 21B is installed on the downstream side of the flow passage change point in the direction changing pipe 20'.

In general, a liquid phase refrigerant has a density higher than that of a gaseous phase refrigerant. For this reason, in a case where droplets W are mixed into the gaseous phase refrigerant R inside the gaseous phase pipe 13, much energy is required to change the direction of a flow of the gaseous phase refrigerant R at the time of passage through the direction changing pipe 20', which results in an increase in a pressure loss.

More specifically, since the gaseous phase refrigerant accompanied by the droplets W becomes a saturated vapor, a fall in pressure leads to a fall in temperature along a saturated vapor line, and this phenomenon is detected by the temperature sensors 21A and 21B, thereby detecting the presence of the droplets W.

That is, a pressure loss in the direction changing pipe 20' is detected as a difference in temperature between the temperature sensors 21A and 21B installed at the direction changing pipe 20', and a controller 22 to be described later prevents excessive refrigerant R from flowing into the vaporizer 11 in order to prevent the above-described pressure loss on the basis of detection results.

In addition, a thermocouple, a thermistor, a temperature measuring resistance body, and the like are used as the temperature sensors 21A and 21B. In addition, the temperature sensors 21A and 21B may be attached to the outer wall of the resistance body 20, or it is also effective to directly measure the temperature of an internal fluid by inserting a thermometer into the inside while adopting a structure in which an internal refrigerant R does not leak by inserting the temperature sensors into piping from an insertion hole or the like through a seal.

Meanwhile, in a case where the temperature sensors are attached to the outer wall, it is desirable to cover the outside of the temperature sensors 21A and 21B with an insulating material in order to accurately measure the internal temperature. In addition, a correlation between the temperature of the internal fluid and the temperature of the outer wall may be obtained in advance, and the temperature of the outer wall may be converted into the temperature of the internal fluid on the basis of the correlation.

The flow rate control means C1 detects the presence of the droplets W in the gaseous phase refrigerant R flowing through the gaseous phase pipe 13 on the basis of a difference between detection values of the state detection sensors 21 which are detected on the upstream side and the downstream side of the resistance body 20 and controls the flow rate of the refrigerant R on the basis of detection results.

That is, the flow rate control means C1 includes the pump 16 and/or the electromagnetic flow rate regulation valve 19 which are provided in the middle of the liquid phase pipe 15 ranging from the condenser 12 to the vaporizer 11, and includes the controller 22 that regulates the amount of discharge of the pump 16 and/or the opening of the flow rate regulation valve 19 to control a flow rate of the refrigerant R in a case where it is determined that a liquid phase is present in the refrigerant R flowing through the pipe passage 3 on the basis of the difference between the detection values of the state detection sensors 21.

Figure 5:
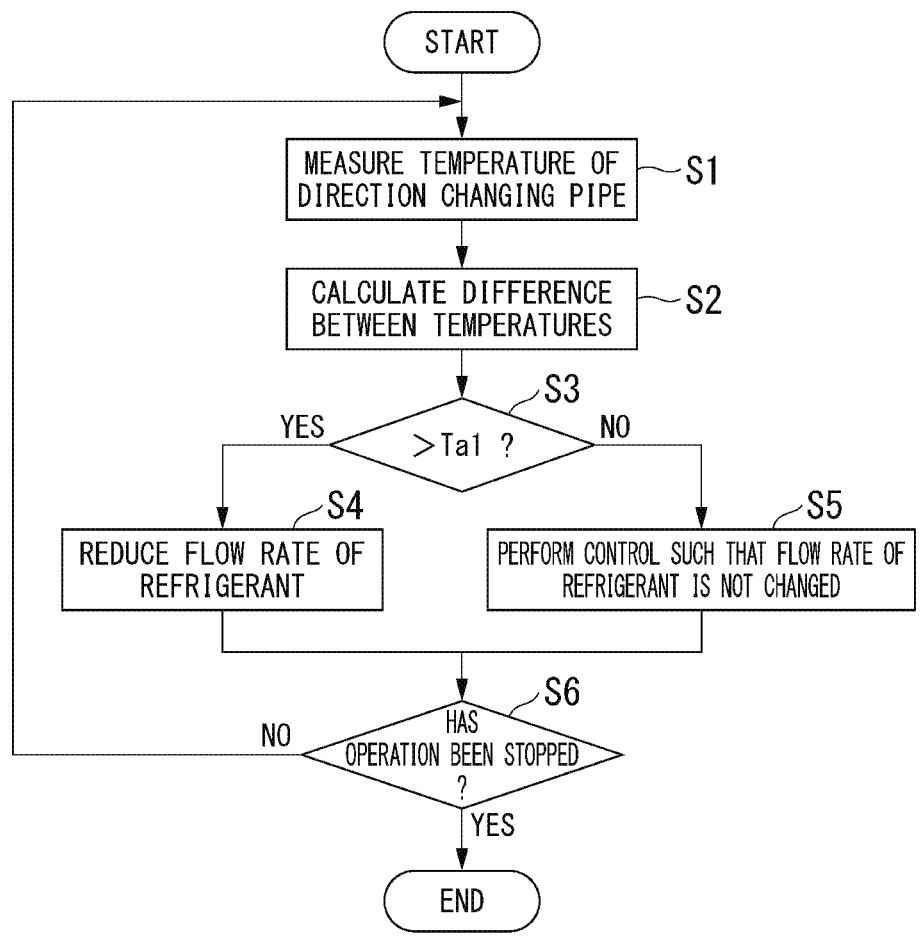
FIG. 5 is a flowchart showing control details which are set in a controller of a flow rate control means.

For example, as shown in a flowchart of FIG. 5, in the controller 22, first, temperatures (t1, t2) of the refrigerant R flowing through the gaseous phase pipe 13 are measured by the temperature sensors 21A and 21B positioned before and behind the direction changing pipe 20' (step S1), and then a difference (Ta) between the temperatures is calculated (step S2).

Thereafter, it is determined in step S3 whether or not the difference (Ta) between the temperatures of the refrigerant R is equal to or greater than a preset threshold value (Ta1). In a case where a determination result is YES, it is assumed that the droplets W are present in the gaseous phase refrigerant R, and control for adjusting the amount of discharge of the pump 16 and/or the opening of the flow rate regulation valve 19 to reduce a flow rate of the refrigerant R to be supplied to the vaporizer 11 is performed (step S4).

Further, in a case where it is determined in step 3 that the difference (Ta) between the temperatures of the refrigerant R is smaller than the preset threshold value (Ta1) which indicates that a determination result is NO, it is assumed that the droplets W are not present in the gaseous phase refrigerant R, and control is performed such that the amount of discharge of the pump 16 and/or the opening of the flow rate regulation valve 19 is not changed (step S5).

Thereafter, it is determined whether or not an instruction indicating stop of operation has been given (step 6). In a case where a determination result is NO, the flow returns to step S1. Further, in a case where a determination result is YES, the flow is terminated.

Meanwhile, the threshold value which is set in step S3 is determined on the basis of a necessary flow rate of a refrigerant, and it is desirable to have a relation of "Ta1=latent heat×mass flow rate".

In addition, the operation of the entire cooling system 101 configured as described above will be described.

First, the vaporizer 11 takes heat away from the outside by vaporizing an internal liquid refrigerant R. In this case, since the amount of refrigerant R for transmitting heat increases when the vaporizer 11 is full of a refrigerant liquid, it is desirable to supply the liquid phase refrigerant R to such a degree that the vaporizer 11 is filled.

However, in a case where an excessive amount of liquid phase refrigerant R is supplied to the vaporizer 11, the liquid phase refrigerant is dragged into a gaseous phase refrigerant vaporized inside the vaporizer 11, the liquid refrigerant flows out in the gaseous phase pipe 13, and the refrigerant R deteriorated in performance or mixed with a liquid is sucked into the compressor 14, which leads to a concern that a failure may occur in the compressor 14.

For this reason, in the cooling system 101 in this example, the liquid phase refrigerant R inside the gaseous phase pipe 13 is detected by the direction changing pipe 20' changing the direction of a flow in the gaseous phase pipe 13 through which the gaseous phase refrigerant R flows and the temperature sensors 21A and 21B provided before and behind the direction changing pipe 20', and the flow rate of the refrigerant is controlled on the basis of detection results.

Further, in a case where the refrigerant R from the vaporizer 11 reaches the direction changing pipe 20', the direction of a flow is forcibly changed. In a case where droplets W are mixed into the liquid phase refrigerant R when the direction is changed, much energy is required to change the direction due to a high density of the droplets W, which results in a significant fall in pressure. Further, when the droplets W are present, a fall in temperature occurs due to a pressure loss, and the fall in temperature is detected by the temperature sensors 21A and 21B provided before and behind the direction changing pipe 20'. In this case, as described in the flowchart of FIG. 5, in a case where a difference between the temperatures determined by the temperature sensors 21A and 21B is large, a significant fall in pressure occurs, and control for reducing a flow rate of the liquid phase refrigerant R to be supplied to the vaporizer 11 is performed.

On the other hand, in a case where it is detected that the liquid phase refrigerant R has not been mixed in on the basis of detection values of the temperature sensors 21A and 21B, the droplets W are not included in the gaseous phase refrigerant R in which a large energy is required to change the direction thereof, and thus a fall in pressure due to the direction changing pipe 20' and a difference between temperatures measured before and behind the direction changing pipe 20' are small.

The gaseous phase refrigerant R of the gaseous phase pipe 13 having passed through the direction changing pipe 20' flows into the compressor 14, and the gaseous phase refrigerant is compressed to have a high temperature. The gaseous phase refrigerant R having a high temperature discharges heat to the outside by being condensed by the condenser 12 and changes to a liquid phase refrigerant. Thereafter, the temperature of the liquid phase refrigerant R is reduced due to a fall in pressure when the liquid phase refrigerant passes through the expansion valve 16. In this state, the liquid phase refrigerant is supplied to the vaporizer 11 again through the pump 18 and the motor-operated valve 19 which are means for controlling a flow rate.

In the cooling system 101 according to the embodiment described above in detail, a resistance is applied to the refrigerant R flowing through the gaseous phase pipe 13 by the direction changing pipe 20' which is the resistance body 20 in the middle of the gaseous phase pipe 13 ranging from the vaporizer 11 to the condenser 12.

In this case, the state (for example, temperature) of the refrigerant R flowing through the gaseous phase pipe 13 is obtained by the state detection sensors 21 on the upstream side and the downstream side of the resistance body 20 which are installed in the gaseous phase pipe 13, and then a flow rate of the refrigerant is regulated by the flow rate control means C1 on the basis of a difference between detection values of the state detection sensors 21.

For example, in a case a difference between temperatures measured by the pair of temperature sensors 21A and 21B provided as the state detection sensors 21 before and behind the resistance body 20 exceeds a predetermined threshold value, it may be determined that droplets W have been mixed into the gaseous phase refrigerant R, and the flow rate control means C1 can perform control for reducing a flow rate of a liquid phase refrigerant to be supplied to the condenser 12.

That is, in the cooling system 101 according to the present invention, in a case where droplets W are mixed into the gaseous phase refrigerant R flowing through the gaseous phase pipe 13 ranging from the vaporizer 11 to the condenser 12, a process of reducing a flow rate of the refrigerant is performed to eliminate a situation where a liquid phase refrigerant is mixed into the gaseous phase refrigerant R, whereby it is possible to efficiently operate an operation cycle.

Modification Examples

Meanwhile, the above-described embodiment may be modified as follows.

(1) There is no limitation to using the direction changing pipe 20' for the resistance body 20, and a flow passage area adjustment means such as an orifice, a throttle, or a baffle plate which applies a resistance to a refrigerant by reducing a cross-sectional area of a flow passage of the gaseous phase pipe 13 may be used.

(2) The direction changing pipe 20' is not limited to being used as the resistance body 20. For example, piping in which a flow passage is disposed in a zigzag shape or a crank shape may be used, or piping having a length ranging from the vaporizer 11 to the compressor 14 may be provided so that a difference in the state of the refrigerant R between both ends of the piping is detected.

(3) The direction changing pipe 20' is not limited to being used as the resistance body 20, and a resistance may be applied to the refrigerant R by disposing a cyclone.

(4) There is no limitation to using the temperature sensors 21A and 21B for the state detection sensor 21, and a pressure sensor may be installed in order to directly detect a difference in the pressure of the refrigerant R. In addition, the present invention is not limited, and a pressure loss of the refrigerant R before and behind the resistance body 20 may be measured using a detection means such as a liquid level meter, a vibration meter, or a wetness meter. Meanwhile, regarding these detection means, the presence of droplets W is determined by comparing a difference between detection values with a preset threshold value, similar to the temperature sensors 21A and 21B.

(5) Although the pump 16 and/or the flow rate regulation valve 19 is used as the flow rate control means C1, the present invention is not limited thereto. A flow rate of the refrigerant R may be regulated using the compressor 14 and the expansion valve 16.

While the embodiment of the present invention has been described in detail with reference to the accompanying drawings, specific configurations are not limited to the embodiment, and changes in design and the like within a range not deviating from the gist of the present invention are also included.

INDUSTRIAL APPLICABILITY

The present invention relates to a heat exchanger and a heat exchange system for efficiently exhausting heat from electronic equipment.

REFERENCE SIGNS LIST

1 Vaporizer
2 Condenser
3 Pipe passage
4 Compressor
5 Pipe passage

6 Pump
7 Flow rate regulation valve
8 Resistance body
9 State detection sensor
11 Vaporizer
12 Condenser
13 Gaseous phase pipe
14 Compressor
15 Liquid phase pipe
16 Expansion valve
18 Pump
19 Flow rate regulation valve
20 Resistance body
21 State detection sensor
21A Temperature sensor
21B Temperature sensor
100 Cooling system
101 Cooling system
R Refrigerant
C Flow rate control means
C1 Flow rate control means

The invention claimed is:

1. A cooling system comprising:
a vaporizer which is configured to absorb heat due to a refrigerant in a liquid phase being vaporized;
a condenser which is configured to discharge heat due to the refrigerant in a gaseous phase state being liquefied;
a resistance body which is provided in a middle of a pipe passage ranging from the vaporizer to the condenser and is configured to apply a resistance to the refrigerant through the pipe passage;
state detection sensors which are provided in the pipe passage on an upstream side and a downstream side of the resistance body and are configured to detect a state of the refrigerant flowing through each side inside the pipe passage; and
a flow rate control mechanism which is configured to detect presence of droplets in the refrigerant flowing through the pipe passage based on a difference between detection values of the state detection sensors which are detected on the upstream side and the downstream side of the resistance body, and control a flow rate of the refrigerant based on detection results.

2. The cooling system according to claim 1, wherein the resistance body is a bent pipe that changes a direction of flow of the refrigerant inside the pipe passage.

3. The cooling system according to claim 2, wherein the bent pipe changes the direction of the flow of the refrigerant inside the pipe passage by 90 degrees.

4. The cooling system according to claim 1, wherein the resistance body includes a flow passage adjustment hole constituted by any one of an orifice and a throttle for applying the resistance to the refrigerant by reducing a cross-sectional area of a flow passage inside the pipe passage.

5. The cooling system according to claim 1, wherein the state detection sensor includes a pair of temperature sensors, positioned on the upstream side and the downstream side of the resistance body, which are each configured to determine a temperature of the refrigerant flowing through the pipe passage.

6. The cooling system according to claim 5, wherein the flow rate control mechanism is configured to reduce the flow rate of the refrigerant in the liquid phase to be supplied to the condenser in a case where a temperature difference exceeds a predetermined threshold value.

7. The cooling system according to claim 6, wherein an electromagnetic flow rate regulation valve is installed to reduce the flow rate of the refrigerant in the liquid phase to be supplied to the condenser.

8. The cooling system according to claim 6, wherein the amount of discharge of a pump provided in a middle of the pipe passage ranging from the condenser to the vaporizer is regulated to reduce the flow rate of the refrigerant in the liquid phase to be supplied to the condenser.

9. The cooling system according to claim 1, wherein a compressor is installed in a middle of the pipe passage ranging from the vaporizer to the condenser and on the downstream side of the resistance body.

10. A refrigerant control method for a cooling system comprising:
a refrigerant,
a vaporizer which is configured to absorb heat due to a refrigerant in a liquid phase being vaporized,
a condenser which is configured to discharge heat due to the refrigerant in a gaseous phase state being liquefied, and
a cooling target positioned in a vicinity of the vaporizer, the cooling target being cooled by circulating the refrigerant between the vaporizer and the condenser,
the refrigerant control method comprising:
applying a resistance to the refrigerant flowing inside a pipe passage ranging from the vaporizer to the condenser,
measuring a difference between a temperature of the refrigerant inside the pipe passage on an upstream side thereof before the resistance is applied to the refrigerant and a temperature of the refrigerant inside the pipe passage on a downstream side thereof after the resistance is applied to the refrigerant, and
reducing a flow rate of the refrigerant in the liquid phase to be supplied to the condenser in a case where a temperature difference is equal to or greater than a threshold value.

* * * * *